United States Patent [19]
Kobaru et al.

[11] Patent Number: 5,614,713
[45] Date of Patent: Mar. 25, 1997

[54] SCANNING ELECTRON MICROSCOPE

[75] Inventors: Atsushi Kobaru; Tadashi Otaka; Tatsuya Maeda; Katsuhiro Sasada, all of Hitachinaka, Japan

[73] Assignee: Hitachi, Ltd., Tokyo, Japan

[21] Appl. No.: 617,030

[22] Filed: Mar. 18, 1996

[30] Foreign Application Priority Data

Mar. 30, 1995 [JP] Japan .................................. 7-72770

[51] Int. Cl.⁶ .......................................... H01J 37/26
[52] U.S. Cl. .......................................... 250/310
[58] Field of Search ........................ 250/310, 396 R, 250/397

[56] References Cited

U.S. PATENT DOCUMENTS

| | | | |
|---|---|---|---|
| 3,800,152 | 3/1974 | Daigne et al. | 250/310 |
| 4,440,475 | 4/1984 | Colliaux | 250/310 |
| 4,990,776 | 2/1991 | Fushimi et al. | 250/310 |
| 5,483,065 | 1/1996 | Sato et al. | 250/310 |

FOREIGN PATENT DOCUMENTS 7139607 8/1982 Japan .
3254649 10/1988 Japan .

*Primary Examiner*—Jack I. Berman
*Assistant Examiner*—Kiet T. Nguyen
*Attorney, Agent, or Firm*—Antonelli, Terry, Stout & Kraus, LLP

[57] ABSTRACT

An electron beam is focused on a specimen by a focusing lens. A light beam is incident on the position of irradiation of the specimen with the electron beam and the reflected light beam is detected by a linear light detector. The output of the detector is used to measure the height of the specimen at the position of irradiation of the electron beam. The specimen is moved in a plane perpendicular to an optical axis of the focusing lens. A specimen height measuring device carries out the height measurement of the specimen at a position to be observed on the specimen and at positions thereon which are in the vicinity of the position to be observed, when those positions are located at the position of irradiation of the electron beam. The specimen height measuring device averages the measured values so as to produce a focusing correction signal on the basis thereof and controls the focusing lens on the basis of the focusing correction signal.

10 Claims, 5 Drawing Sheets

SCANNING ELECTRON MICROSCOPE

BACKGROUND OF THE INVENTION

The present invention relates to a scanning electron microscope, and more particularly to a scanning electron microscope which is suitable for observing semiconductor wafers with a high resolution in the course of inspecting the wafers during their production.

Disclosed in Japanese Patent Laid-Open No. 63-254649(1988) is a scanning electron microscope in which a specimen is irradiated with a light beam emitted from a light source, such as a laser, and the reflected light beam from the specimen is detected by a position detector such as a linear sensor. The output of the sensor is used to produce an electric signal representative of the moving distance of the specimen, in the direction of an electron beam, or the height of the specimen, and the produced signal is used to control a focusing electron lens so as to focus the electron beam on the specimen.

However, for a specimen, such as a semiconductor wafer, which has optical disturbances on its surface, including a difference in reflectance, the measured result includes an error due to the optical disturbances. This is because the intensity, or the intensity distribution, of the light beam detected by the sensor is changed where there is a difference in reflectance depending on the position, due to a circuit pattern formed on the wafer.

In this connection, in the arrangement disclosed in Japanese Patent Application Laid-Open No.57-139607 (1982), the measuring accuracy of the height of the specimen is improved by reducing the light spot diameter on the specimen and by feedback-controlling the light source so that the amount of light incident on the detector always becomes equal to a pre-set reference value in order to reduce any change in the light intensity distribution.

When the light beam is incident on the specimen such as a semiconductor wafer having optical disturbances, especially, fine pits and projections, such as formed by circuit patterns on its surface, the optical disturbances scatter the reflected light to disturb the result detected by the sensor. As a result, the focusing cannot be carried out with a high accuracy.

Further, even if the light spot diameter on the specimen is reduced and the light source is feedback-controlled so that the amount of light incident on the detector always becomes equal to a pre-set reference value in order to reduce any change in light intensity distribution, it is impossible to remove the error contained in the measured result caused by the scattering of the reflected light due to the pits and projections on the surface of the specimen.

SUMMARY OF THE INVENTION

An object of the present invention is to provide a scanning electron microscope in which the focusing of an electron beam on a specimen can be carried out with high accuracy even if the specimen has a surface on which fine pits and projections are formed.

According to an aspect of the present invention, a scanning electron microscope is provided which comprises means for generating an electron beam; means for irradiating a specimen with the electron beam; means for focusing the electron beam on the specimen; means for scanning the specimen with the electron beam so as to generate from the specimen a signal characteristic thereof; means for detecting the generated signal so as to display an image of the specimen on the basis of the detected signal; means for moving the specimen in a plane transverse to the electron beam; means for measuring physical quantities related to the height of the specimen at a position to be observed on the specimen and at least one position on the specimen which is in the vicinity of the position to be observed thereon; and means for producing a statistical focusing correction signal on the basis of the measured physical quantities and for controlling either the focusing means or the moving means on the basis of the produced statistical focusing correction signal so as to focus the electron beam on the specimen when the position to be observed on the specimen is subject to irradiation of the electron beam.

In the above scanning electron microscope, preferably, the statistical focusing correction signal is representative of an average of the measured physical quantities.

In the above scanning electron microscope, preferably, the measuring means measures the physical quantities at a measurement position when the position to be observed on the specimen and the at least one position thereon are located at the measurement position by means of the moving means.

According to another aspect of the present invention, a scanning electron microscope is provided which comprises means for generating an electron beam; means for irradiating a specimen with the electron beam; means for focusing the electron beam on the specimen, means for scanning the specimen with the electron beam so as to generate from the specimen a signal characteristic thereof; means for detecting the generated signal so as to display an image of the specimen on the basis of the detected signal; means for moving the specimen in a plane transverse to the electron beam; means for measuring, at a measurement position, physical quantities related to the height of the specimen at a position to be observed on the specimen and at least one position on the specimen which is in the vicinity of the position to be observed thereon; means for producing a statistical focusing correction signal on the basis of the measured physical quantities and for controlling either the focusing means or the moving means on the basis of the produced statistical focusing correction signal so as to focus the electron beam on the specimen when the specimen is so moved that the position to be observed on the specimen is subject to irradiation of the electron beam.

According to a further aspect of the present invention, a scanning electron microscope is provided which comprises means for generating an electron beam; means for irradiating a specimen with the electron beam; means for focusing the electron beam on the specimen means for scanning the specimen with the electron beam so as to generate from the specimen a signal characteristic thereof; means for detecting the generated signal so as to display an image of the specimen on the basis of the detected signal; means for moving the specimen in a plane transverse to the electron beam; means for measuring, at a measurement position, physical quantities related to the height of the specimen at a plurality of positions of irradiation of the electron beam when the specimen is moved; means for producing a statistical focusing correction signal on the basis of the measured physical quantities and for controlling the focusing means on the basis of the produced statistical focusing correction signal so as to focus the electron beam on the specimen when the specimen is so moved that a position to be observed on the specimen is subject to irradiation by the electron beam, the position to be observed on the specimen being one of a plurality of positions and being also a position of irradiation of the specimen with the electron beam when movement of the specimen is stopped.

Other objects and features of the present invention will be become apparent from the descriptions of preferred embodiments of the present invention taken in connection with the accompanying drawings.

DESCRIPTION OF THE PREFERRED EMBODIMENTS

Figure 1:
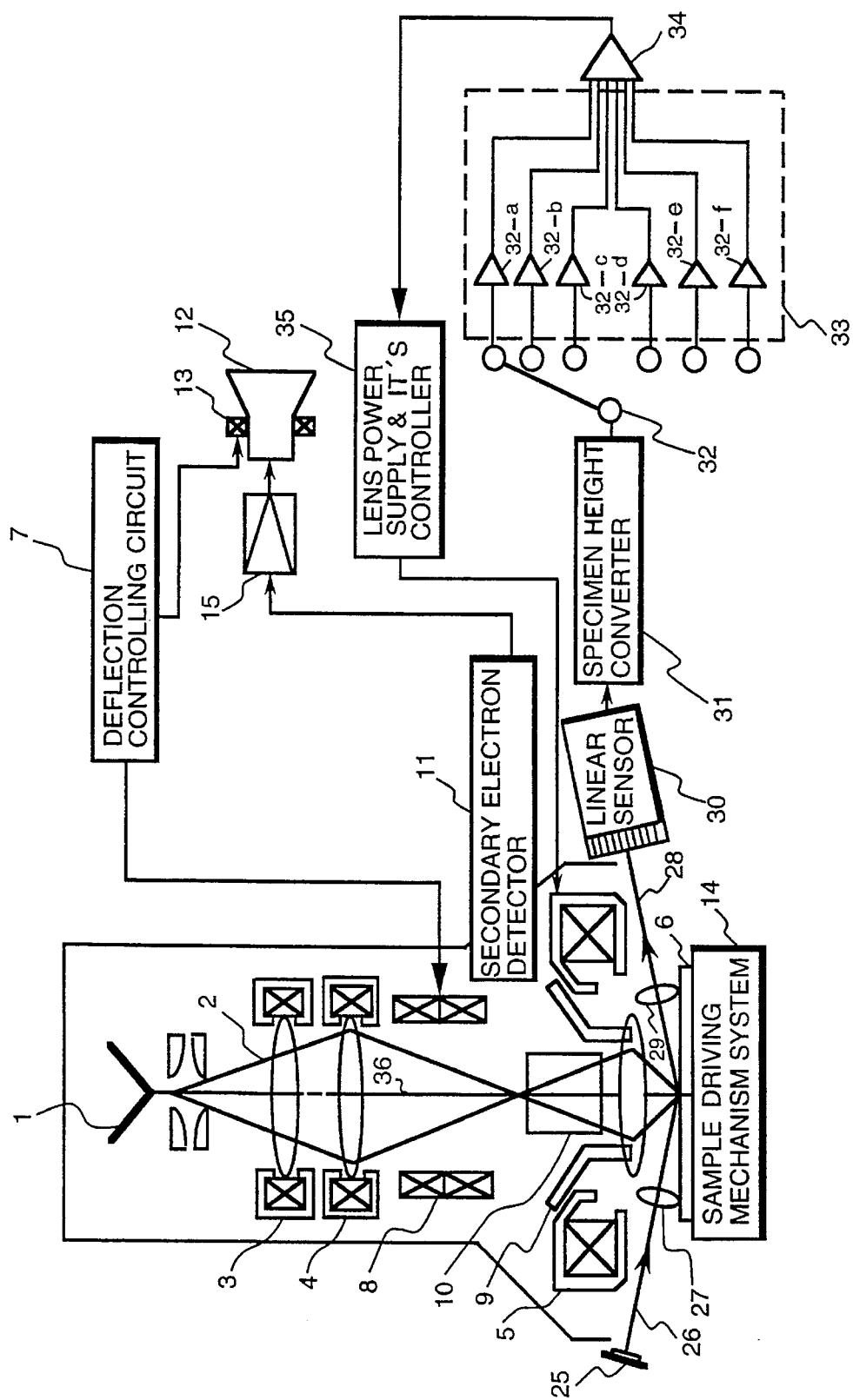
FIG. 1 is a block diagram of a scanning electron microscope showing an embodiment in accordance with the present invention.

Referring to FIG. 1, an electron beam 2 emitted from an electron gun 1 is focused on a specimen 6, such as a semiconductor wafer, by first and second condenser electron lenses 3 and 4 and an objective electron lens 5, which serves as a focusing electron lens. An electron beam deflection controlling circuit 7 generates X- and Y-axis electron beam deflection signals, which are introduced into an electron beam deflector 8 arranged between the second condenser electron lens 4 and the objective electron lens 5 around an electro-optical axis 36, so that the specimen 6 is scanned two-dimensionally with the electron beam 2.

The specimen 6 produces secondary electrons, reflected electrons, light, etc. characteristic of the specimen 6. The secondary electrons are accelerated by an acceleration electrode 9 and the accelerated secondary electrons are detected by a secondary electron detector 11 through a filter 10, which generates a magnetic field and a electric field perpendicular to each other, so as to convert the accelerated secondary electrons into a video electric signal. The video electric signal is conducted to a cathode ray tube 12 through a video signal amplifier 15 as a brightness modulation signal.

The X- and Y-axis electron beam deflection signals generated by the electron beam deflection controlling circuit 7 are also supplied to an electron beam deflector 13 of the cathode ray tube 12. Therefore, an image of the specimen 6 due to the secondary electrons is displayed on the cathode ray tube 12.

The specimen 6 is held by a specimen driving mechanism system 14, which is designed to move the specimen 6 not only in a plane transverse to the electron beam 2, but also in a upward and downward direction, i.e., in the direction of the height of the specimen 6.

In order to observe an arbitrary position on the surface of the specimen 6, the specimen 6 is moved in a plane transverse to the electron beam 2, more specifically in a direction perpendicular to the electro-optical axis 36. When the position of the surface of the specimen 6 in the direction of the electro-optical axis 36 is changed as a result of movement for some reason, for example, warpage in the surface of the specimen 6 itself or displacement from a certain plane perpendicular to the electro-optical axis 36 of the specimen driving mechanism system 14, the surface of the specimen 6 does not coincide with the point of focus of the electron beam 2. The difference is assumed to be a focus displacement $\Delta Z$.

Where it is necessary to automatically control the focusing electron lens 5, for example, in order to automatically focus during observation after moving the specimen 6, it is required to know the focus displacement $\Delta Z$. The focus displacement $\Delta Z$ may be obtained by using a specimen height measuring device. According to the device, a laser beam emitted from a laser beam source 25 is incident on the surface of the specimen 6 along an optical axis 26 so as to be focused on the surface of the specimen 6 by a lens 27 and is reflected from the specimen 6 into a light detector, i.e., a linear sensor 30, disposed along an optical axis 28 through a lens 29, so as to converted into an electric signal by the linear sensor 30. Hereinafter, the laser beam is referred to as incident light.

Figure 2:
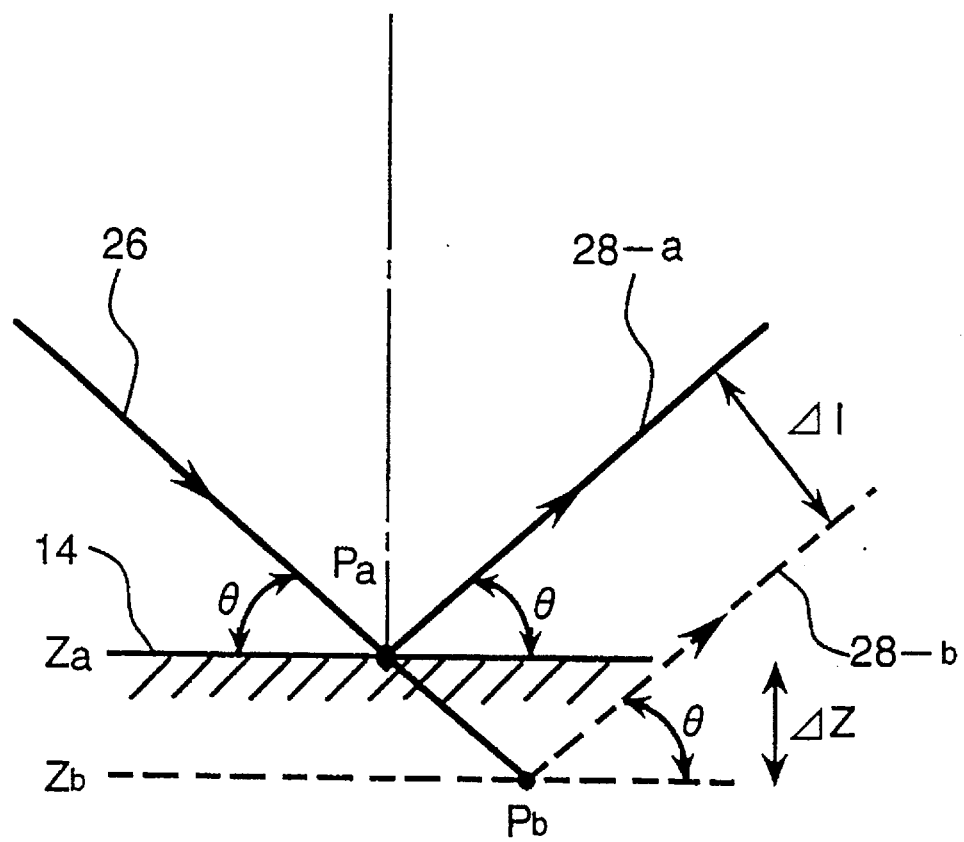
FIG. 2 is a view for explaining the principle of measurement of the height of the specimen in accordance with the present invention.

Referring to FIG. 2, the surface of the specimen 6 is assumed to be placed at a height level of $Z_a$. The incident light emitted from the laser beam source 5 is reflected at a point $P_a$ on the surface of the specimen 1 when it hits the surface. If the height level of the surface of the specimen 6 is displaced by a height of $\Delta Z$ from the position $P_a$ to a position $Z_b$, the position of the surface becomes as shown by a dashed line in the figure. Since the reflected position of the incident light 26 is shifted to a point $P_b$, the reflected light is not directed toward the linear sensor 10 along not the optical axis 28-$a$, but is directed along the optical path 28-$b$ keeping the same reflecting angle $\theta$ as before. The light path difference $\Delta l$ in the direction perpendicular to the optical axes 8-$a$ and 8-$b$ becomes the displacement of the focus position of the reflected light on the linear sensor 10. The relationship between the light path difference $\Delta l$ and the focus displacement $\Delta Z$ can be expressed by equation (1) and is a linear relationship.

$$\Delta Z = \Delta l \times \sin \theta \qquad (1)$$

Therefore, the focus displacement $\Delta Z$ can be obtained or known by detecting the light path difference $\Delta l$ using the linear sensor 10 and by converting it using Equation (1).

The output electric signal of the linear sensor 10 indicating the light path difference $\Delta l$ is converted into an electric signal indicating the focus displacement $\Delta Z$ according to Equation (1) by a sensor output/specimen height converter 31. However, when there are optical disturbances, such as projections and depressions or a difference in surface reflectance, on the surface of the specimen 6, the light intensity of the reflected light is changed even when the intensity of the incident light is constant. In addition to this, the intensity distribution of light on the focus point of the reflected light in the linear sensor 30 is shifted from the Gaussian distribution which the incident light has. In such a case, the linear sensor 30 erroneously detects the spot indicating the focus position of the reflected light in the direction perpendicular to the optical axis 28-$b$ of the reflected light. That is, when the intensity distribution of light in the spot is changed, the position of the center representing the detecting position of the spot on the linear sensor 30 is changed and consequently the measured value of the focus displacement $\Delta Z$ contains a measurement error.

Figure 3:
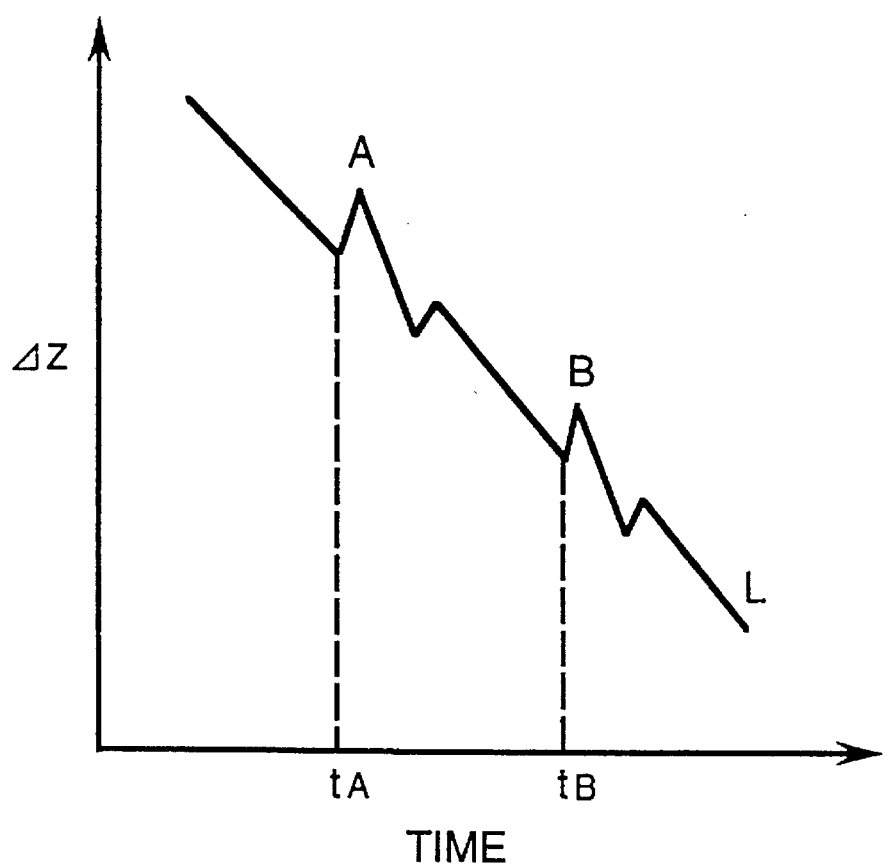
FIG. 3 is a graph showing a position detecting result when the specimen is moved in a conventional way.

Since the specimen 6 is moved in the plane perpendicular to the electro-optical axis 36 by the specimen driving mechanism system 14, the output of the sensor output/specimen height converter 31 is as shown in FIG. 3. The measured result of the focus displacement $\Delta Z$ is changed along a straight line or a curved line L according to a change in the surface height of the specimen. However, at the time $t_a$ or $t_b$, for example, when the position of the optical disturbance on the specimen surface coincides with the focus position of the incident light P-a or P-b, the measured result of the focus displacement $\Delta Z$ departs from the line L to produce a portion A or B.

Figure 4:
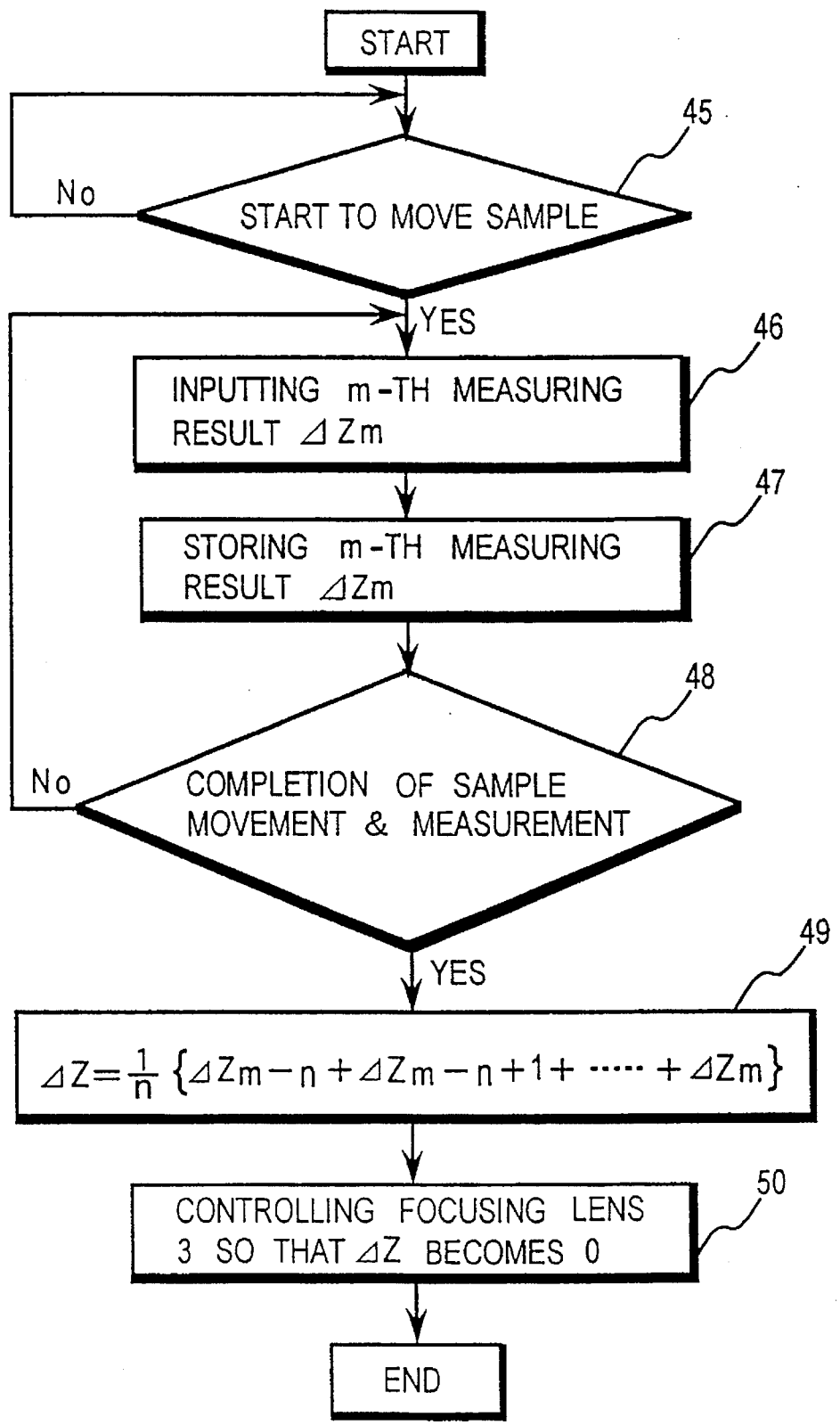
FIG. 4 is a flow chart showing a calculation process for obtaining a corrected position measurement result in accordance with the present invention.
Figure 5:
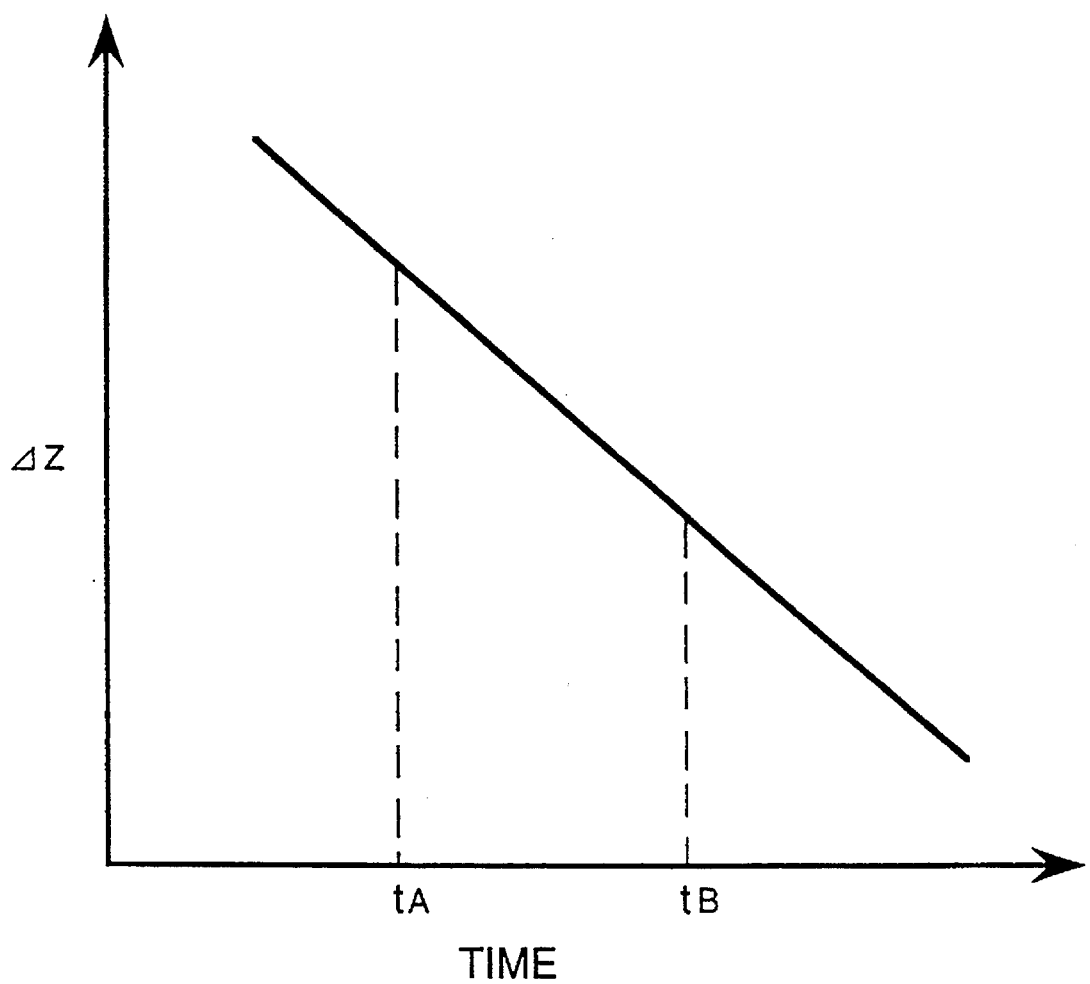
FIG. 5 is a graph showing a position measurement result in accordance with the present invention.

The output electric signal of the sensor output/specimen height converter 31 indicating the measured value of the focus displacement $\Delta Z$ is switched every certain period using the time dividing switch 33 to distribute and store measured values in a plurality of holding circuits 32-$a$ to 32-$f$ of a holding circuit unit 32 with time. The initial output of the sensor output/sample height converter 11 is input to the holding circuit 32-$a$ by the time dividing switch 33. The next output is input to the holding circuit 32-$b$, and the remaining outputs are input to the selected holding units 32-$c$ to 32-$f$ in order. After the last output is input to the holding unit 32-$f$, the time dividing switch 33 is switched to the holding circuit 32-$a$ having the first output value. Then, the operation is repeated, so that the measured results of the focus displacement $\Delta Z$ are always temporarily held according to the number of the holding circuits 32-$a$ to 32-$f$, i.e., six in the case of this embodiment. The steps carried out to effect focusing will be explained with reference to the flow chart of FIG. 4.

Step 45

Initially, the specimen 6 is moved by the specimen driving mechanism system 14 so that a position to be observed on the specimen 6 coincides with a measurement position at which the measurement of height of the specimen 6 is to be carried out. The measurement position is also a position in which the specimen is subject to irradiation by the electron beam.

Step 46

As the specimen driving system 4 starts to be driven, the measurement of height of the specimen is started by the specimen height measuring device to obtain a measured value of the focus displacement $\Delta Z$ from the sensor output/specimen height converter 31. The measured value of the focus displacement $\Delta Z$ is input to the holding circuit unit 32 in synchronism with the time dividing switch 12. Here, let the m-th measured result be $\Delta Z_m$.

Step 47

Next, the focus displacement $\Delta Z_m$ of the output of the sensor output/specimen height converter 31 is temporarily stored in a selected one of the holding circuits by the time dividing switch 33.

Step 48

When the position to be observed on the sample coincides with the measurement position, the driving of the specimen driving mechanism system 4 is completed and further the measurement of the focus displacement $\Delta Z$ and the switching operation by the time dividing switch 12 are completed. If not completed, the processing is returned to the step 46 to perform (m+1)-th measurement next.

Step 49

If it is assumed that the last measured result is $\Delta Z_m$ and the number of the holding circuits is n, in an averaging calculation circuit 34, the focus displacement at the position of the irradiation of the specimen with the electron beam after completion of driving of the specimen driving mechanism system 14 can be obtained according to equation (2).

$$\Delta Z = \{\Delta Z_{m-n} + \Delta Z_{m-n+1} + \ldots \Delta Z_m\}/n \quad (2)$$

That is, the final focus displacement $\Delta Z$ is defined as the average value of the measured values stored in the n holding circuits. It should be noted that respective values of the values stored in the holding circuits 32-$a$ to 32-$f$ are related to the height of the specimen at corresponding positions on the specimen which are in the vicinity of one another and are measured when those positions are located at the measurement position.

Step 50

A lens power supply and it's controller 35 generates a focusing correction signal for cancelling out the focus displacement $\Delta Z$ and controls the focusing electron lens 5 on the basis of the focusing correction signal so that the focus displacement $\Delta Z$ obtained in step 49 becomes zero by changing the position of focus of the electron beam in the direction of the electro-optical axis 36. By doing so, control of the focusing electron lens 5 becomes equivalent to control using the measured result of the focus displacement $\Delta Z$ which does not depart from the line L at the time $t_a$ and $t_b$ when the position of the optical disturbance on the sample surface coincides with the measurement position, i.e., the position of focus of the incident light.

Instead of the method in which focusing is performed by moving the position of focus in the direction of the axis 36 as described above, it is possible that the focus displacement $\Delta Z$, i.e., difference between the position of focus of the electron beam and the height of the sample surface, is made 0 (zero) by moving the specimen driving mechanism system 14 in the direction of the axis 36.

Though the displacement $\Delta Z$ is a simple mean value, as apparent from the above, it may be a weighted mean value of the output signals of the holding circuits 32-$a$ to 32-$f$. In this case, weight coefficients may be determined according to the degree of importance of the measured values. In general, the degree of importance of the measured values depends on the distance between a position to be observed on the specimen and a position thereon which is in the vicinity thereof at which the height of the specimen is measured at the measurement position. Namely, it is increased as the distance becomes short.

In order to measure the height of the specimen at a plurality of positions thereon, which are in the vicinity of one another, a light beam scanner may be so used as to deflect or scan the incident light beam while keeping the specimen stationary in place of moving the specimen in a plane perpendicular to the electro-optical axis 36 while keeping the incident light beam stationary. In this case, after the specimen is so moved that one of the plurality of positions, i.e., a position to be observed is subject to irradiation of by the electron beam, the incident light beam may be deflected or scanned so as to irradiate the plurality of positions therewith in turn. The light beam scanner itself is omitted in the figures, since it is well known.

Since the displacement $\Delta Z$ is a simple mean value, as apparent from the above, the focusing correction signal can be called a so-called statistical focusing correction signal.

With the series of operations, the position of the focus of the electron beam can coincide with the surface of the specimen 6 without being affected by an optical disturbance on the surface of the sample.

According to the embodiment of the present invention, the focusing of an electron beam on a specimen can be carried out with a high accuracy even if the specimen has a surface on which fine pits and projections are formed.

Further, the focusing of a scanning electron microscope can be stably performed with high speed, and accordingly it is possible to improve the throughput in a scanning electron microscope used as an inspection apparatus in the field of semiconductor manufacture.

Since it is obvious that many changes and modifications can be made in the above described details without departing from the nature and spirit of the present invention, it is to be understood that the present invention is not to be limited to the details described herein.

What is claimed is:

1. A scanning electron microscope, comprising: means for generating an electron beam; means for irradiating a specimen with the electron beam; means for focusing the electron beam on the specimen; means for scanning the specimen with the electron beam so as to generate from the specimen a signal characteristic thereof; means for detecting the generated signal so as to display an image of the specimen on the basis of the detected signal; means for moving the specimen in a plane transverse to the electron beam; means for measuring physical quantities related to the height of the specimen at a position to be observed on the specimen and at least at one position on the specimen which is in the vicinity of the position to be observed thereon; and means for producing a statistical focusing correction signal on the basis of the measured physical quantities and for controlling one of the focusing means and the moving means on the basis of the produced statistical focusing correction signal so as to focus the electron beam on the specimen when the position to be observed on the specimen is subject to irradiation by the electron beam.

2. A scanning electron microscope according to claim 1, wherein the statistical focusing correction signal is representative of an average of the measured physical quantities obtained at respective positions.

3. A scanning electron microscope according to claim 1, wherein the measuring means measures the physical quantities at a measurement position when the position to be observed on the specimen and the at least one position thereon are positioned at the measurement position by means of the moving operation.

4. A scanning electron microscope according to claim 1, wherein the statistical focusing correction signal is representative of an average of the measured physical quantities obtained at respective positions and the measuring means measures the physical quantities at a measurement position, when the position to be observed on the specimen and the at least one position thereon are positioned at the measurement position by operation of the moving means.

5. A scanning electron microscope according to claim 1, wherein the statistical focusing correction signal is representative of an average of the measured physical quantities obtained at respective positions and the measuring means measures the physical quantities at a measurement position, when the position to be observed on the specimen and the at least one position thereon are positioned at the measurement position by operation of the moving means.

6. A scanning electron microscope, comprising: means for generating an electron beam; means for irradiating a specimen with the electron beam; means for focusing the electron beam on the specimen; means for scanning the specimen with the electron beam so as to generate from the specimen a signal characteristic thereof; means for detecting the generated signal so as to display an image of the specimen on the basis of the detected signal; means for moving the specimen in a plane transverse to the electron beam; means for measuring, at a measurement position, physical quantities related to the height of the specimen at a position to be observed on the specimen and at least one position on the specimen which is in the vicinity of the position to be observed thereon; means for producing a statistical focusing correction signal on the basis of the measured physical quantities and for controlling one of the focusing means and the moving means on the basis of the produced statistical focusing correction signal so as to focus the electron beam on the specimen when the specimen is so moved that the position to be observed on the specimen is subject to irradiation by the electron beam.

7. A scanning electron microscope according to claim 6, wherein the statistical focusing correction signal is representative of an average of the measured physical quantities obtained at respective positions.

8. A scanning electron microscope according to claim 6, wherein the measuring means measures the physical quantities at a measurement position, when the position to be observed on the specimen and the at least one position thereon are positioned at the measurement position by operation of the moving means.

9. A scanning electron microscope, comprising: means for generating an electron beam; means for irradiating a specimen with the electron beam; means for focusing the electron beam on the specimen; means for scanning the specimen with the electron beam so as to generate from the specimen a signal characteristic thereof; means for detecting the generated signal so as to display an image of the specimen on the basis of the detected signal; means for moving the specimen in a plane transverse to the electron beam; means for measuring, at a measurement position, physical quantities related to the height of the specimen at a plurality of positions of irradiation of the electron beam when the specimen is moved; means of producing a statistical focusing correction signal on the basis of the measured physical quantities and for controlling the focusing means on the basis of the produced statistical focusing correction signal so as to focus the electron beam on the specimen when the specimen is so moved that a position to be observed on the specimen is subject to irradiation of the electron beam, the position to be observed on the specimen being one of the plurality of positions and also being a position of irradiation of the specimen by the electron beam when movement of the specimen is stopped.

10. A scanning electron microscope according to claim 9, wherein the statistical focusing correction signal is representative of an average of the measured physical quantities at said plurality of positions.

\* \* \* \* \*